(12) United States Patent
Becker et al.

(10) Patent No.: US 11,346,722 B2
(45) Date of Patent: May 31, 2022

(54) METHOD FOR FABRICATING A DETECTION DEVICE COMPRISING A STEP OF TRANSFERRING AND DIRECT BONDING OF A THIN LAYER PROVIDED WITH A GETTER MATERIAL

(71) Applicant: Commissariat à l'Energie Atomique et aux Energies Alternatives, Paris (FR)

(72) Inventors: Sébastien Becker, Grenoble (FR); Frank Fournel, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 14 days.

(21) Appl. No.: 17/105,839

(22) Filed: Nov. 27, 2020

(65) Prior Publication Data

US 2021/0181025 A1    Jun. 17, 2021

(30) Foreign Application Priority Data

Nov. 27, 2019    (FR) ...................... 19 13331

(51) Int. Cl.
*G01J 5/04*    (2006.01)
*G01J 5/02*    (2022.01)

(52) U.S. Cl.
CPC ............... *G01J 5/045* (2013.01); *G01J 5/024* (2013.01)

(58) Field of Classification Search
CPC .... G01J 5/045; G01J 5/024; G01J 5/10; G01J 5/20; H01L 27/14649; H01L 27/14683; H01L 31/1876; H01L 23/26; H01L 31/0203; H01L 31/115; H01L 27/14698; H01L 27/1462
See application file for complete search history.

(56) References Cited

U.S. PATENT DOCUMENTS

2018/0321087 A1* 11/2018 Leduc .................. G01J 5/045

OTHER PUBLICATIONS

French Preliminary Search Report dated Apr. 17, 2020 in French Application 19 13331 filed on Nov. 27, 2019 (with English Translation of Categories of Cited Documents & Written Opinion), 9 pages.

* cited by examiner

*Primary Examiner* — David P Porta
*Assistant Examiner* — Meenakshi S Sahu
(74) *Attorney, Agent, or Firm* — Oblon, McClelland, Maier & Neustadt, L.L.P.

(57) ABSTRACT

The invention relates to a method for fabricating a detection device 1, comprising the following steps:
  forming a stack 10, comprising a thermal detector 20, a mineral sacrificial layer 15 and a thin encapsulation layer 16 having a lateral indentation 4;
  forming a stack 30, comprising a thin supporting layer 33, a getter portion 34 and a thin protective layer 35;
  directly bonding the thin supporting layer 33 to the thin encapsulation layer 16 so that the getter portion 34 is located in the lateral indentation 4;
  forming a vent 17, and eliminating the mineral sacrificial layer 15 and the thin protective layer 35;
  depositing a thin sealing layer 5, blocking the vent 17.

12 Claims, 5 Drawing Sheets

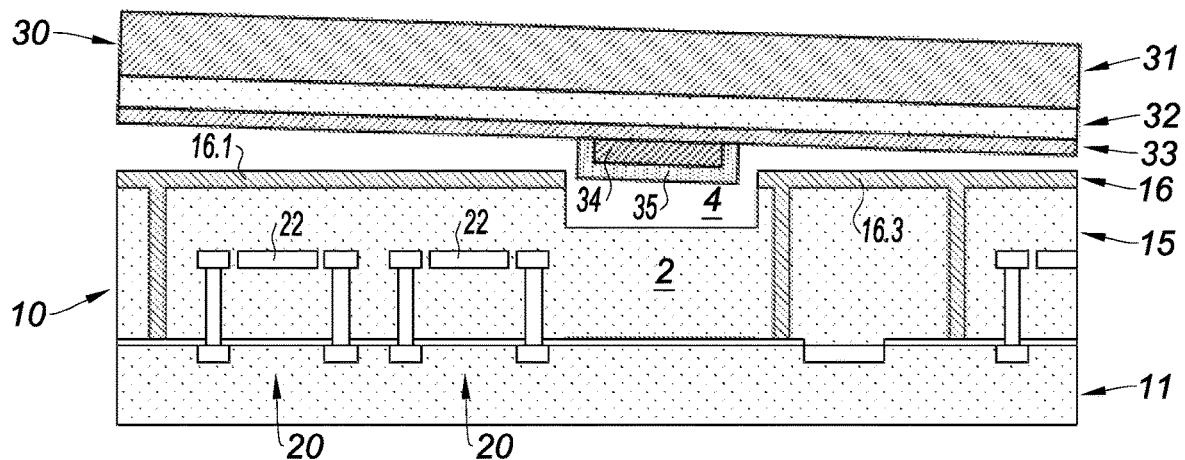
Fig. 1D
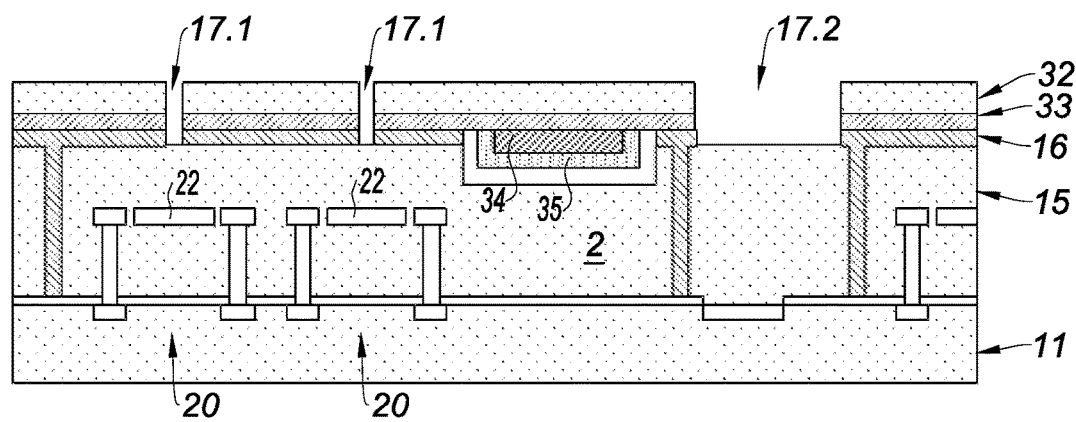
Fig. 1E
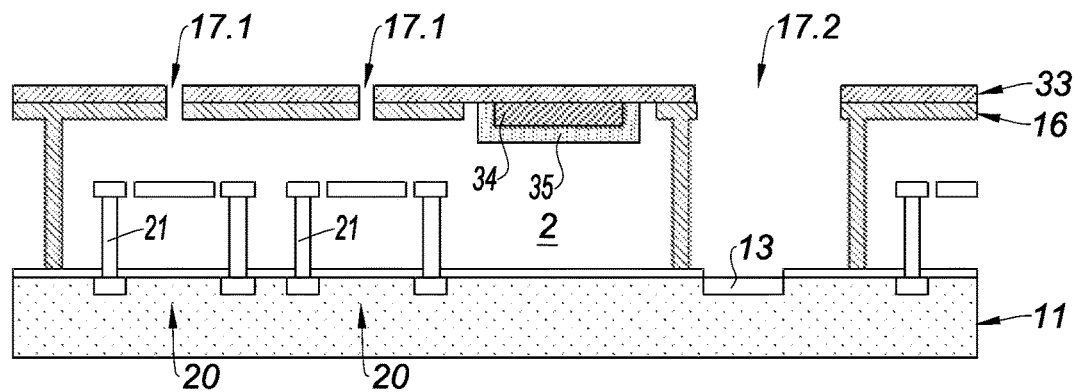
Fig. 1F
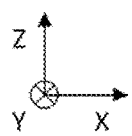

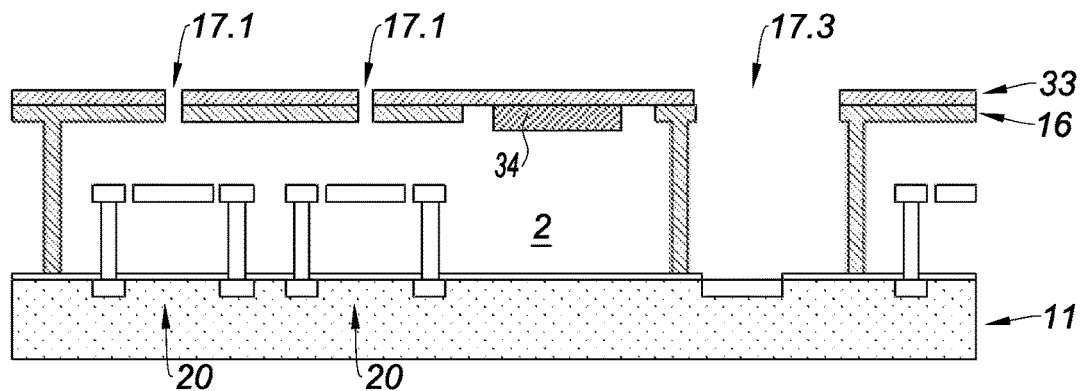
Fig. 1G
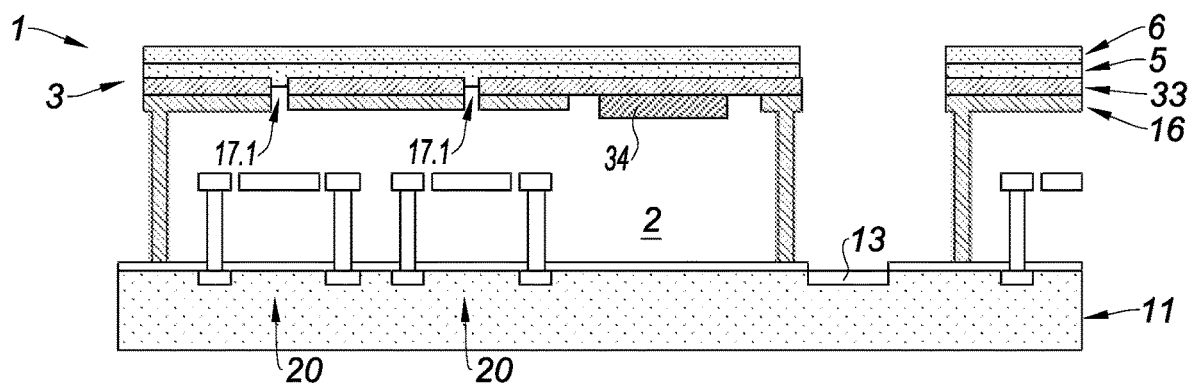
Fig. 1H
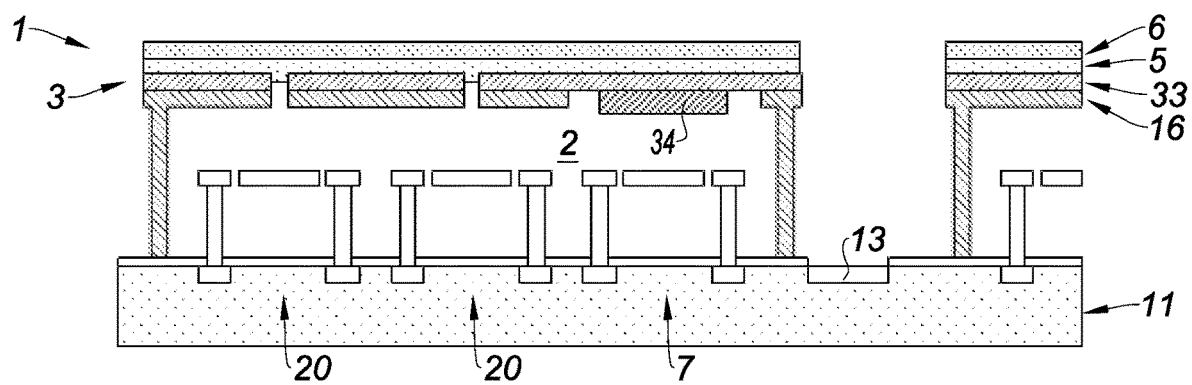
Fig. 2
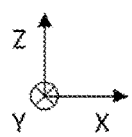

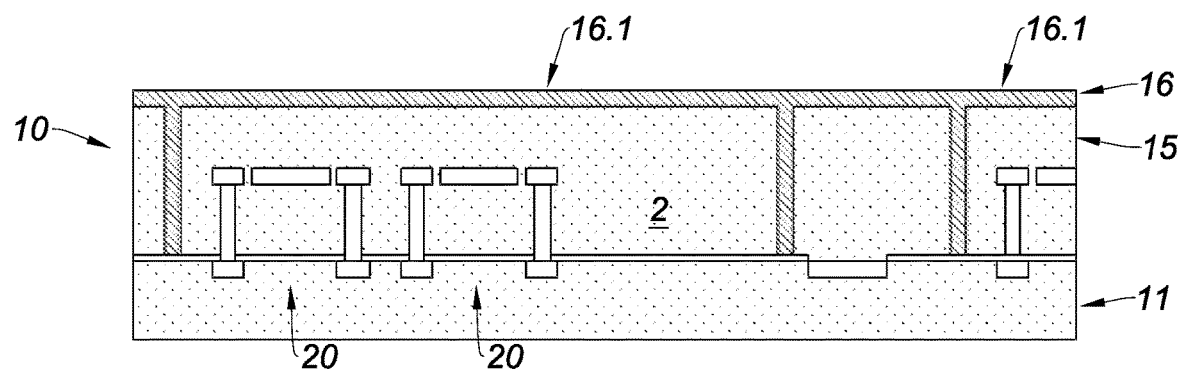
Fig. 3A
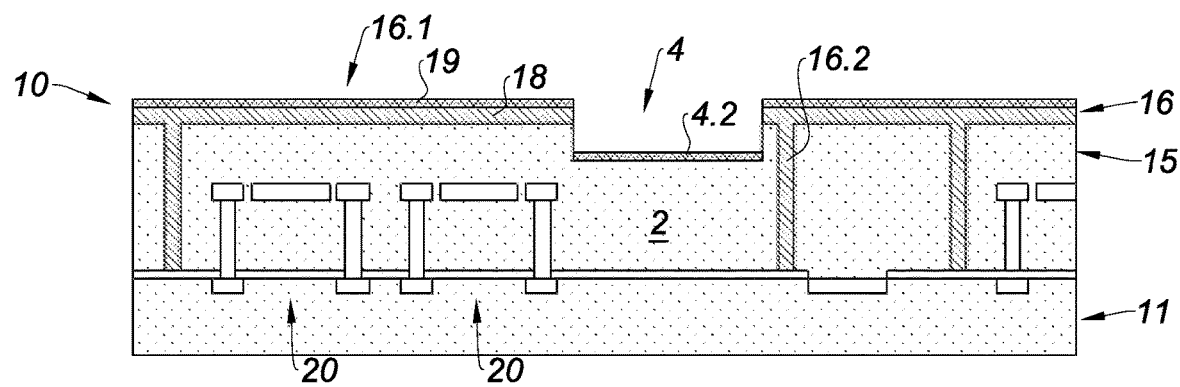
Fig. 3B
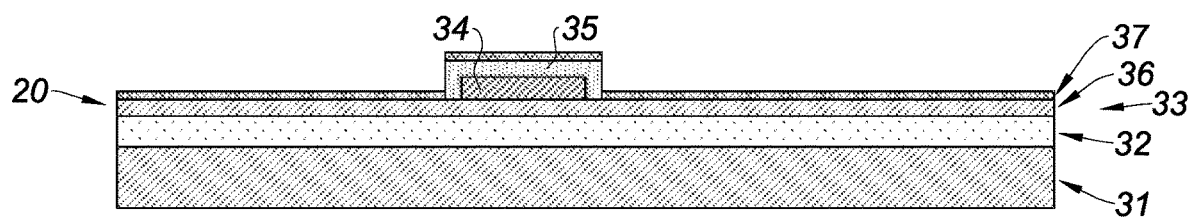
Fig. 3C
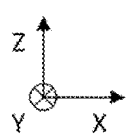

METHOD FOR FABRICATING A DETECTION DEVICE COMPRISING A STEP OF TRANSFERRING AND DIRECT BONDING OF A THIN LAYER PROVIDED WITH A GETTER MATERIAL

TECHNICAL FIELD

The field of the invention is that of devices for detecting electromagnetic radiation, particularly infrared or terahertz radiation, comprising at least one thermal detector encapsulated in a sealed cavity in which a getter material is also located. The invention is applicable, notably, to the field of infrared imaging and thermography.

PRIOR ART

A device for detecting electromagnetic radiation, for example infrared or terahertz radiation, may comprise an array of thermal detectors, each comprising an absorbent portion for absorbing the electromagnetic radiation to be detected.

To provide thermal insulation for the thermal detectors, the absorbent portions usually take the form of membranes suspended above the substrate by anchoring pillars, and thermally insulated from the substrate by supporting and thermal insulation arms. These anchoring pillars and thermal insulation arms also have an electrical function, by electrically connecting the suspended membranes to a readout circuit that is usually positioned in the substrate.

The readout circuit usually takes the form of a CMOS circuit. It may be used for applying a control signal to the thermal detectors and for reading detection signals generated by the detectors in response to the absorption of the electromagnetic radiation to be detected. The readout circuit comprises different levels of electrical interconnection formed by metallic lines separated from one another by dielectric layers called inter-metal layers. At least one electrical connecting block of the readout circuit is positioned on the substrate in such a way that it can be contacted from the outside of the detection device.

The document EP3239670A1 describes a method for fabricating a detection device that uses mineral sacrificial layers for forming the thermal detectors, these layers being subsequently eliminated by wet chemical etching. A portion of a getter material, made of titanium for example, is located under each absorbent membrane, and is protected from the wet chemical etching by a carbonaceous sacrificial thin layer which is subsequently eliminated by special dry chemical etching. Thus the mineral sacrificial layers momentarily cover the carbonaceous sacrificial thin layer. However, there is a need to improve the mechanical strength of the stack produced during the different steps of the fabrication method, particularly when the steps of planarizing the sacrificial thin layers are carried out, and to limit the risks of structural degradation of the elements or layers forming this stack.

The document EP3399290A1 describes another method for fabricating a detection device, in which the encapsulation structure defining the sealed cavity is formed by the transfer of a thin cap. More precisely, a first stack is formed, comprising the thermal detectors and the peripheral pillars, and having a peripheral sealing surface made of a metallic material, for example copper. A second stack is formed, comprising a thin layer forming the thin cap, provided with a getter portion and a peripheral sealing surface made of a metallic material, for example copper. This second stack is applied to the first (i.e. transferred onto the first), and the peripheral sealing surfaces are brought into contact and bonded to one another. The getter portion is covered with a protective layer to prevent its degradation during wet chemical etching that is used to eliminate the mineral sacrificial layers. However, there is a need to simplify the structure of the detection device on the one hand, and to simplify the fabrication method on the other hand, notably by avoiding the use of copper for the bonding of the two stacks, since this material may not be available in some technological procedures.

DISCLOSURE OF THE INVENTION

The object of the invention is to overcome, at least in part, the drawbacks of the prior art. For this purpose, the invention proposes a method for fabricating a device for detecting electromagnetic radiation comprising the following steps:

forming a first stack, comprising: at least one thermal detector resting on a first substrate, intended to detect the electromagnetic radiation, and covered with at least one mineral sacrificial layer made of a mineral material that can be eliminated by chemical etching; and a thin encapsulation layer, extending above the thermal detector and contributing to the delimiting of a cavity in which the thermal detector is located, comprising an upper part resting on the mineral sacrificial layer; at least one indentation, called a lateral indentation, extending through the upper part of the thin encapsulation layer and part of the mineral sacrificial layer, and being located at a distance from the thermal detector in a plane parallel to the first substrate;

forming a second stack, comprising: a thin layer called the supporting layer, transparent to the electromagnetic radiation, resting on a supporting substrate; at least one getter portion positioned on the thin supporting layer and partially covering the latter; and a thin protective layer, covering the getter portion, and made of a carbonaceous material that can be eliminated by a second chemical etching;

assembling the first and second stacks by bringing the thin supporting layer into contact with the upper part of the thin encapsulation layer and directly bonding it thereto, so that the getter portion is located in the lateral indentation; then forming at least one release vent through the thin supporting layer and the upper part of the thin encapsulation layer, opening onto the mineral sacrificial layer; then eliminating the mineral sacrificial layer by the first chemical etching;

eliminating the thin protective layer by the second chemical etching;

depositing a thin sealing layer on the thin supporting layer so as to block the release vent.

Certain preferred but nonlimiting aspects of this method are the following.

The thin encapsulation layer may extend continuously above and around the thermal detector. Thus it may comprise the upper part and also a peripheral part that extends across the mineral sacrificial layer and rests on the first substrate.

The assembly step may be carried out at ambient temperature with a vacuum pressure less than or equal to $10^{-5}$ Pa.

The carbonaceous material of the thin protective layer may be chosen from amorphous carbon and polyimide.

The lateral indentation may have dimensions such that, in the assembly step, the thin protective layer is at a distance from the mineral sacrificial layer, preferably in a plane parallel to the plane of the substrate and along an axis orthogonal to the plane of the substrate.

The thin encapsulation layer may be silicon-based, and the thin supporting layer may be silicon- or germanium-based.

The thin encapsulation layer may have a contact surface made of silicon, and the thin supporting layer may have a contact surface made of silicon or germanium. The step of assembly by direct bonding may comprise activation of said contact surfaces by partial ion beam etching and vacuum bonding.

The upper part of the thin encapsulation layer may be formed by a sub-layer made of silicon and a first bonding sub-layer, and the thin supporting layer may be formed by a silicon- or germanium-based sub-layer and a second bonding sub-layer, the two bonding sub-layers being transparent to the electromagnetic radiation to be detected. The step of assembly by direct bonding may comprise bringing the two metallic sub-layers into contact with one another under a vacuum.

Said bonding sub-layers may each have a thickness less than or equal to 1 nm.

Said bonding sub-layers may be made of a metallic material or of amorphous carbon.

The first stack may comprise a plurality of arrays of thermal detectors, each array being located in a distinct cavity delimited at least partially by a thin encapsulation layer, the thin supporting layer coming into contact with the upper parts of the different thin encapsulation layers.

The getter portion may be positioned facing a thermal detector called a compensation detector, which is intended not to receive the electromagnetic radiation, the getter portion being opaque to the electromagnetic radiation.

The invention also relates to a device for detecting an electromagnetic radiation, and consequently a part of the encapsulation structure is a thin supporting layer with a flat upper surface, which is advantageous when the addition of optical components (such as filters) is desired. It comprises:
- a substrate;
- at least one thermal detector resting on the substrate, intended to detect the electromagnetic radiation;
- a thin encapsulation layer, extending over the thermal detector and contributing to the delimiting of a cavity in which the thermal detector is located, comprising an upper part;
  - at least one indentation, called a lateral indentation, extending through the upper part of the thin encapsulation layer, and located at a distance from the thermal detector in a plane parallel to the plane of the substrate;
- a thin layer called the supporting layer, transparent to the electromagnetic radiation, resting in contact with the upper part of the thin encapsulation layer, the thin supporting layer having a flat upper surface opposite the substrate;
- at least one getter portion assembled onto the thin supporting layer and positioned in the lateral indentation;
- at least one release vent extending through the thin supporting layer and the upper part of the thin encapsulation layer;
- a thin sealing layer covering the thin supporting layer and blocking the release vent.

BRIEF DESCRIPTION OF THE DRAWINGS

Other aspects, aims, advantages and features of the invention will become more clearly apparent upon reading the following detailed description of preferred embodiments thereof, which description is given by way of non-limiting example and with reference to the appended drawings, in which:

FIGS. 1A to 1H show different steps of a method for fabricating a detection device according to a first embodiment in which the direct bonding is of the SAB (for Surface Activated Bonding) type;

FIG. 2 is a schematic and partial sectional view of a detection device produced according to a variant of the first embodiment of the invention, in which the getter portion is positioned facing a compensation thermal detector;

FIGS. 3A to 3F show different steps of a method for fabricating a detection device according to a second embodiment in which the direct bonding is of the ADB (for Atomic Diffusion Bonding) type.

DETAILED DISCLOSURE OF PARTICULAR EMBODIMENTS

Figure 1A:
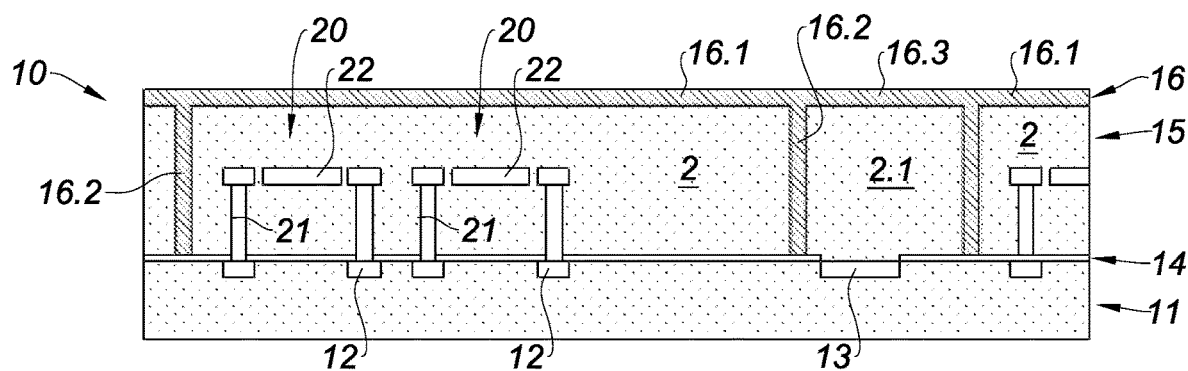

In the figures and in the remainder of the description, the same references have been used to designate identical or similar elements. In addition, the various elements are not shown to scale for the sake of clarity of the figures. Moreover, the various embodiments and variants are not mutually exclusive and may be combined with one another. Unless indicated otherwise, the terms "substantially", "around", "of the order of" mean to within 10%, and preferably to within 5%. Moreover, the terms "between . . . and . . . " and the like mean that the bounds are included, unless indicated otherwise.

The invention relates in a general way to a method for fabricating an electromagnetic radiation detection device capable of detecting infrared or terahertz radiation. This detection device comprises one or more thermal detectors, together with at least one material acting as a getter, located in a sealed cavity. The sealed cavity is delimited by an encapsulation structure which is formed by a plurality of thin layers that are transparent to the electromagnetic radiation to be detected, including, notably, a thin encapsulation layer extending continuously over the thermal detectors, and, if necessary, continuously over and around the latter. "Thin layer" is taken to mean a layer formed by the material deposition techniques used in microelectronics, with a thickness that is preferably less than or equal to 10 μm. A thin layer is said to be transparent when it has a transmission factor for a central wavelength of the spectral range of the electromagnetic radiation to be detected that is greater than or equal to 50%, preferably equal to 75%, or possibly equal to 90%.

As a general rule, a material acting as a getter is a material intended to be exposed to the atmosphere of the sealed cavity and capable of carrying out gas pumping by absorption and/or adsorption. It is a metallic material, which may be chosen from among titanium, zirconium, vanadium, chromium, cobalt, iron, manganese, palladium, barium and/or aluminum, or an alloy of these metals such as TiZrV.

The fabrication method also comprises a step of producing the thermal detector or detectors by using at least one sacrificial layer known as a mineral layer, made of a mineral or inorganic material. In this case, the material is a silicon-based dielectric material which can also be used to form an inter-metal dielectric layer of the readout circuit, that is to say an electrically insulating material which, for example, has a dielectric constant, or relative permittivity, of less than or equal to 3.9, thus limiting the parasitic capacitance between the interconnections. This mineral material has no carbon chains, and may be a silicon oxide SiOx or a silicon nitride $Si_xN_y$, or an organosilicon material such as SiOC, SiOCH, or a material of the fluoride glass type such as SiOF. The mineral sacrificial layer may be eliminated by a wet chemical etching process, such as chemical etching in an acid medium, for example using hydrofluoric acid in the vapor phase (HF vapor). "Wet etching" is taken to mean, in a general manner, that the etching agent is present in the liquid or vapor phase, preferably in the vapor phase in this case.

According to the invention, the getter material forms what is called a getter portion, or block, positioned on a thin supporting layer which is applied and assembled by direct bonding onto the thin encapsulation layer. Direct bonding, sometimes called molecular bonding or bonding by molecular adhesion, is the fixing of two surfaces brought into contact with one another, without the addition of a special bonding material such as a resin or a polymer, but by the use of the attractive forces of atomic or molecular interaction between the surfaces to be bonded, such as Van der Waals forces or covalent or metallic bonds. It is a spontaneous bonding at ambient temperature. The ambient temperature may be a temperature of 40° C. or less, for example approximately 25° C. The direct bonding may be temperature-assisted in order to increase the bonding energy and thus reinforce the adhesion of the surfaces and consequently the sealing of the cavity, for example by annealing after the step of bonding at ambient temperature.

Additionally, since the mineral sacrificial layer or layers are eliminated after this step of transferring and direct bonding, the getter portion is coated with a thin protective layer of carbonaceous material. A carbonaceous material is a material formed of at least one type of chemical species including carbon atoms. Thus it may be a mineral material such as amorphous carbon, possibly of the DLC (for Diamond Like Carbon), or an organic material such as polyimide. Carbon of the DLC type is amorphous carbon with a high rate of carbon spa hybridization. Preferably, the carbonaceous material comprises no silicon, thereby avoiding the presence of any residues after the step of eliminating this sacrificial layer. The thin protective layer is thus substantially inert in relation to the wet chemical etching carried out to eliminate the mineral sacrificial layer. "Substantially inert" is taken to mean that the carbonaceous material does not react substantially with the etching agent used in the step of eliminating the mineral sacrificial layer, or only reacts slightly, so that the thin protective layer, at the end of this elimination step, still covers the getter material entirely. The thin protective layer is capable of being eliminated by chemical etching, such as dry chemical etching, for which an example of an etching agent is oxygen contained in a plasma.

In the transferring step, in order to enable the getter portion protected by the carbonaceous material to be introduced into the cavity, a lateral indentation is formed in such a way that it extends toward the readout substrate through the thin encapsulation layer and part of the mineral sacrificial layer. This indentation (also called a notch) is called lateral, because it is at a distance, in a plane parallel to the substrate, from the thermal detector or detectors intended to receive the electromagnetic radiation.

FIGS. 1A to 1F show different steps of a method for fabricating a detection device 1 according to a first embodiment in which the direct bonding is of the SAB (Surface Activated Bonding) type. For the sake of clarity, only a part of the detection device 1 is shown in the figures. In this example, the method enables a plurality of detection devices 1, preferably identical to one another, to be fabricated simultaneously.

By way of example, in this case the thermal detectors 20 are capable of detecting infrared radiation in the LWIR (Long Wavelength Infrared) range, the wavelength of which is between approximately 8 µm and 14 µm. In this case, each detection device 1 comprises one or more thermal detectors 20, and in this case an array of identical thermal detectors 20, connected to a readout circuit located in the substrate 11 (which is then called the readout substrate), and located in the same sealed cavity 2. Thus the thermal detectors 20 form sensitive pixels arranged periodically, and may have a lateral dimension in the plane of the readout substrate 11 of the order of a few tens of microns, for example equal to approximately 10 µm or less. The thin encapsulation layer also extends continuously over and around the thermal detectors in this case. However, other configurations of the thin encapsulation layer are possible.

At this point, and for the rest of the description, a three-dimensional direct reference system XYZ will be defined, where the plane XY is substantially parallel to the plane of the readout substrate 11, the axis Z being oriented in a direction substantially orthogonal to the plane of the readout substrate 11 leading toward the thermal detectors 20. The terms "vertical" and "vertically" are to be interpreted as relating to an orientation substantially parallel to the axis Z, and the terms "horizontal" and "horizontally" are to be interpreted as relating to an orientation substantially parallel to the plane XY. Additionally, the terms "lower" and "upper" are to be interpreted as relating to a positioning that increases with distance from the readout substrate 11 in the direction +Z.

With reference to FIG. 1A, a first stack 10 is formed, comprising:
  a first substrate 11, called the readout substrate;
  at least one array of thermal detectors 20 resting on the readout substrate 11, intended to detect the electromagnetic radiation, and covered with at least one mineral sacrificial layer 15;
  a thin encapsulation layer 16, extending continuously over the array of thermal detectors 20 along the axis Z and around the array in the plane XY.

In this example, a plurality of arrays of thermal detectors 20 rest on the readout substrate 11, and each is surrounded by the same thin encapsulation layer 16 which is intended to subsequently form thin encapsulation layers that are distinct from one another. Each thin encapsulation layer 16 is then intended to delimit a cavity 2 which in this case houses an array of thermal detectors 20.

The readout substrate 11 is silicon-based, and is formed by a supporting substrate containing the readout circuit (not shown) capable of controlling and reading the thermal detectors 20. In this case, the readout circuit takes the form of a CMOS integrated circuit. It comprises, among other elements, portions of conducting lines separated from one another by inter-metal insulating layers made of a dielectric material, for example a silicon-based mineral material such as silicon oxide $SiO_x$, silicon nitride $SiN_x$, among others. Conducting portions 12 are flush with the surface of the supporting substrate, and provide the electrical connection of the anchoring pillars 21 of the thermal detectors 20 to the readout circuit. Additionally, in this case one or more connecting portions 13 are flush with the surface of the supporting substrate, and enable the readout circuit to be connected to an external electronic device.

The readout substrate 11 may comprise a reflector (not shown) positioned facing each thermal detector 20. The reflector may be formed by a portion of a conducting line of the last level of interconnection, this line being made of a material capable of reflecting the electromagnetic radiation to be detected. It extends facing the absorbent membrane 22 of the thermal detector 20, and is intended to form with the latter a quarter-wave interference cavity for the electromagnetic radiation to be detected.

Finally, the readout substrate 11 in this case comprises a protective layer 14 such that the upper inter-metal insulating layer, notably, is covered. This protective layer 14 corresponds in this case to an etching stop layer made of a material that is substantially inert to the chemical etching agent used subsequently to eliminate the different mineral sacrificial layers 15, in the HF medium in the vapor phase for example. This protective layer 14 thus forms a sealed, chemically inert layer which is electrically insulating to prevent any short circuit between the anchoring pillars 21. Thus it can prevent the underlying inter-metal insulating layers from being etched during this step of eliminating the mineral sacrificial layers 15. It may be formed of an aluminum oxide or nitride, or of aluminum trifluoride, or of amorphous silicon which is not intentionally doped. The protective layer 14 does not cover the connecting portions 13, thereby enabling them to be electrically connected to an external electrical device.

The thermal detectors 20 are then formed on the readout substrate 11. These production steps are identical or similar to those described, notably, in the document EP3239670A1. The thermal detectors 20 in this case are microbolometers, each comprising an absorbent membrane 22, that is to say a membrane capable of absorbing the electromagnetic radiation to be detected, suspended above the readout substrate 11 by anchoring pillars 21, and thermally insulated from the substrate by supporting and thermal insulation arms. Absorbent membranes 22 are conventionally produced by surface micro-machining techniques consisting in the formation of the anchoring pillars 21 through a first mineral sacrificial layer, and the formation of the thermal insulation arms and the absorbent membranes 22 on the upper surface of the sacrificial layer. Each absorbent membrane further comprises a thermometric transducer, for example a thermistor material connected to the readout circuit by electrical connections provided in the thermal insulation arms and in the anchoring pillars 21.

A second mineral sacrificial layer, preferably of the same kind as the first mineral sacrificial layer, is then deposited. The second mineral sacrificial layer covers the mineral sacrificial layer and the thermal detectors 20. In the drawings, the two mineral sacrificial layers are shown together with the reference 15.

The thin encapsulation layer 16 of an encapsulation structure is then formed in a similar way to that described in the document EP3239670A1, for each array of thermal detectors 20. Firstly, conventional photolithography techniques are used to etch the mineral sacrificial layers 15 locally to form trenches opening onto the readout substrate 11. The conforming deposition of the thin encapsulation layer 16, of amorphous silicon in this case, is then carried out, this layer extending over the mineral sacrificial layer 15 and into the trenches, by chemical vapor deposition (CVD, for Chemical Vapor Deposition) for example. Evidently, the encapsulation layer 16 may comprise supporting pillars as described, notably, in the document EP3067674A2.

The thin encapsulation layer 16 therefore comprises an upper part 16.1 (also called the upper wall) which extends above, and at a distance along the axis Z from, the thermal detectors 20, and a peripheral part 16.2 (also called the peripheral wall) which continuously surrounds the thermal detectors 20 in the plane XY. The upper wall 16.1 therefore rests on, and in contact with, the mineral sacrificial layer 15. The thin encapsulation layer 16 is intended to delimit the cavity 2 along the direction +Z and in the plane XY.

In this example, the same thin encapsulation layer 16 is deposited in such a way that it continuously covers the different arrays of thermal detectors 20 and extends into the different trenches. Additionally, the upper walls 16.1 extending above the adjacent arrays of thermal detectors 20 are interconnected by an intermediate upper wall 16.3, which in this case overhangs the connecting portions 13. A lateral cavity 2.1 is then formed between two adjacent cavities 2. It is delimited by the intermediate upper wall 16.3 and by the peripheral walls 16.2 that delimit two adjacent cavities 2. It is filled by the mineral sacrificial layers 15. It may extend so that it at least partially surrounds, in the plane XY, the same array of thermal detectors 20. The thin encapsulation layer 16 also extends continuously over and around the thermal detectors 20. The upper wall 16.1 extends above the thermal detectors 20, and the peripheral wall 16.2 surrounds the thermal detectors 20 in the plane XY. The upper wall 16.1 and the peripheral wall 16.2 are therefore formed in one piece and from the same material(s).

In a variant, different thin encapsulation layers 16 may be formed, these layers then being distinct from one another, each belonging to a different detection device 1. For this purpose, the intermediate upper wall 16.3 is locally etched so as to separate the different thin encapsulation layers 16. A peripheral opening may then be formed, so that the encapsulation material does not extend above the connecting portion or portions 13.

Figure 1B:
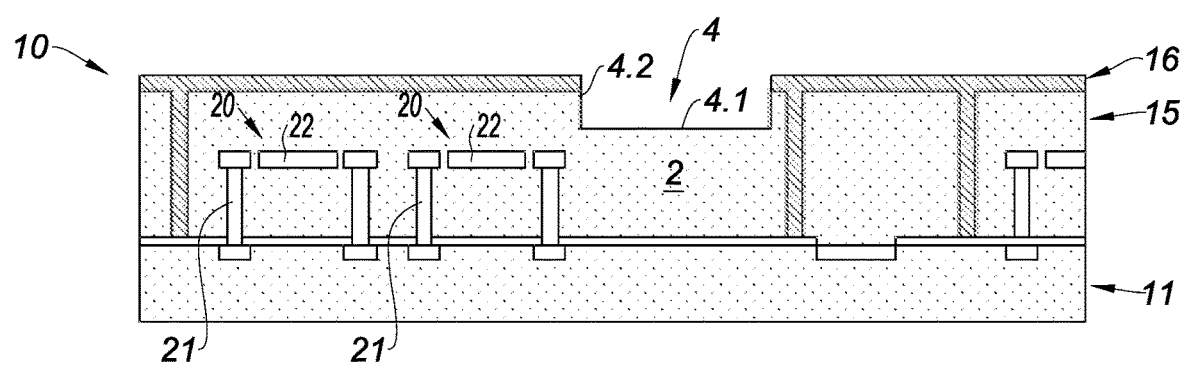

With reference to FIG. 1B, at least a first indentation 4, called a lateral indentation, is formed by photolithography and etching in the thin encapsulation layer 16 and in part of the mineral sacrificial layer 15. The lateral indentation 4 is formed by anisotropic dry etching (physical etching), for example RIE etching. At this stage, the release vents 17.1 for allowing the discharge of the mineral sacrificial layers 15 from the cavity 2 are not yet formed.

The lateral indentation 4 is intended to allow the introduction into the cavity 2 of at least one getter portion 34, covered by a thin protective layer 35, the getter portion 34 being fixed to a thin supporting layer 33 that is applied and assembled by direct bonding onto the thin encapsulation layer 16. The lateral indentation 4 has dimensions adapted to those of the getter portion 34 covered by the thin protective layer 35, so as to allow the getter portion 34, protected in this way, to be introduced into the space delimited by the lateral indentation 4. Preferably, the dimensions of the lateral indentation 4 are adapted so that, after the transferring and direct bonding, the thin protective layer 35 is at a distance from the mineral sacrificial layer 15, that is to say spaced apart from the mineral sacrificial layer 15 in the plane XY and along the axis Z by a non-zero distance.

The lateral indentation 4 is a recess formed from the upper surface of the first stack in the direction −Z. It extends through the thin encapsulation layer 16 in the direction −Z, and then extends partially into the mineral sacrificial layer 15. It is spaced apart from the readout substrate along the axis Z by part of the mineral sacrificial layer 15. It therefore has a bottom surface 4.1 defined by the upper surface of the mineral sacrificial layer 15 and extending in a substantially parallel manner to the plane XY, and an edge surface 4.2 defined by the mineral sacrificial layer 15 and by the thin encapsulation layer 16 and extending in a substantially parallel manner to the axis Z.

The indentation 4 is said to be lateral in that it is at a distance from the optically active thermal detectors 20 in a plane parallel to the plane of the readout substrate 11, that is to say the thermal detectors 20 intended to detect the infrared radiation, so that the presence of the getter portion 34 does not interfere with the transmission of the electromagnetic radiation to be detected. The lateral indentation 4 is therefore spaced at a non-zero distance from these thermal detectors 20, and more precisely from the absorbent membranes 22, and preferably also from the thermal insulation arms and the anchoring pillars 21. As described below, it may, however, overhang a compensation thermal detector 7, that is to say a thermal detector that is said to be blind, since it is intended not to receive or detect the electromagnetic radiation.

By way of example, the lateral indentation 4 has dimensions in the plane XY and a depth along the axis Z such that it can receive a getter portion 34 covered by a thin protective layer 35, by means of an alignment margin in the bonding of the stacks. The dimensions of the getter portion 34 in the plane XY depend on the arrangement of the getter portion in relation to the detector or detectors. These dimensions may thus be of the order of several mm$^2$ so that, for example, this portion extends vertically over a plurality of compensation detectors, or may have much smaller dimensions, notably when a grid of getter portions is provided. The thickness of the getter portion may be about 100 nm to 1 µm, typically 300 nm. The thin protective layer 35 may have a thickness of several tens to hundreds of nanometers, typically 200 nm.

Figure 1C:
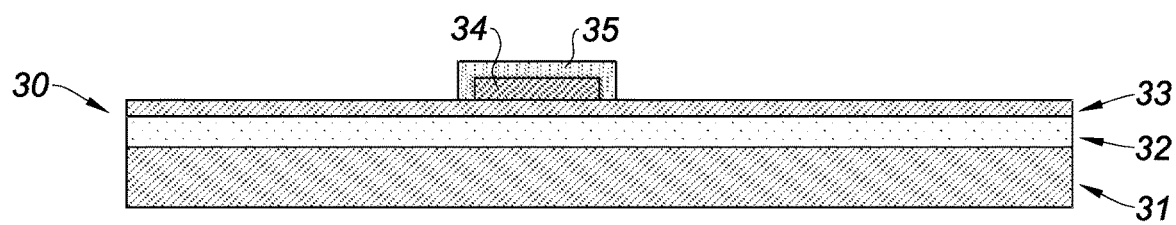
Figure 1C:
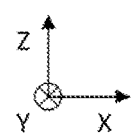

With reference to FIG. 1C, a second stack 30 is formed. This step may be carried out before, during or after the steps described previously. The second stack 30 comprises:
- a supporting substrate 31, 32;
- a thin layer called the sealing layer 33, resting on the supporting substrate and made of a material that is transparent to the electromagnetic radiation to be detected;
- at least one getter portion 34 positioned on the thin supporting layer 33 and partially covering the latter;
- a thin protective layer 35, covering the getter portion 34, made of a carbonaceous material that can be eliminated by chemical etching such as $O_2$ plasma etching.

The second stack 30 may be based on an SOI substrate or a GeOI substrate. The supporting substrate is then formed from a silicon substrate 31 having a thickness of several hundred microns for example, and from a buried oxide (BOX) layer 32. The thin supporting layer 33 may be made of silicon in the case of an SOI substrate, or of germanium in the case of a GeOI substrate. The material and the thickness of the thin supporting layer 33 are chosen so that it is transparent to the electromagnetic radiation to be detected.

Thus it may have a thickness less than or equal to 200 µm or possibly 10 µm, or preferably less than or equal to 5 µm, for example equal to about 100 nm.

In this example, the thin encapsulation layer 16 is formed of a single material, amorphous silicon in this case, so that the upper wall 16.1 and the peripheral wall are entirely made of amorphous silicon. The thin supporting layer 33 is also formed from a single material, in this case silicon (for an SOI substrate) or germanium (for a GeOI substrate). In a variant, as described below, the thin encapsulation layer 16 and the thin supporting layer 33 may be, at least locally, multilayers, the surfaces to be brought into contact then being formed by bonding sub-layers.

The getter portion 34 is made of a material having a getter action, for example titanium. It is entirely covered by the thin protective layer 35 made of a carbonaceous material, which is preferably made of amorphous carbon, and has a thickness ranging from several tens of nanometers to several hundred nanometers, for example between 50 nm and 500 nm, or possibly between 100 nm and 300 nm, so as to provide good coverage of the getter portion 34.

If the carbonaceous material is amorphous carbon, it may be deposited in a thin layer by a suitable chemical deposition technique such as plasma enhanced chemical vapor deposition (PECVD, for Plasma Enhanced Chemical Vapor Deposition) or physical vapor deposition (PVD, for Physical Vapor Deposition), by the sputtering of a carbon target by an ion beam (IBS) for example. In the case of polyimide, it may be deposited by dispensing followed by centrifuging (spin coating). The thin protective layer 35 is deposited so as to entirely cover the getter portion 34, but in this case it does not extend substantially over the thin supporting layer 33 (except at the edge of the getter portion 34), thus leaving free a surface of the thin supporting layer 33 intended to come into contact with the thin encapsulation layer 16 in the step of assembly by direct bonding.

The carbonaceous material is thus inert in relation to an etching agent, particularly hydrofluoric acid in the vapor phase, that is used in the chemical etching carried out subsequently to eliminate the mineral sacrificial layers 15. This is the case with polyimide, which shows little reaction with hydrofluoric acid, and therefore is not eliminated throughout its thickness at the end of this wet chemical etching step, the getter portion 34 thus remaining entirely covered by a non-zero thickness of the thin protective layer 35. This is also the case with amorphous carbon, which shows substantially no reaction with this etching agent. However, the carbonaceous material is capable of reacting with an etching agent used in the chemical etching carried out subsequently to eliminate this thin protective layer 35, particularly with the oxygen present in a dry chemical etching plasma.

With reference to FIG. 1D, the second stack 30 is assembled onto the first stack 10 by bringing the thin supporting layer 33 into contact with the thin encapsulation layer 16 under a vacuum and directly bonding it thereto. In this example, the same thin supporting layer 33 of the second stack 30 is brought into contact with the different upper walls 16.1, and in this case with the intermediate upper wall 16.3.

The surfaces brought into mutual contact and assembled by direct bonding are substantially flat. Thus a preliminary step of planarizing the thin encapsulation layer 16 may be carried out before the forming of the lateral indentation 4. A step of planarizing the thin supporting layer 33 may also be carried out before the forming of the getter portion 34 and the deposition of the thin protective layer 35.

The direct bonding is preferably what is known as SAB (Surface Activated Bonding). This bonding technique is notably suitable for the direct bonding of two silicon layers at ambient temperature, without any intermediate bonding material such as resin or polymer.

For this type of direct bonding, pressure during bonding may increase the bonding energy. This bonding technique is, notably, described in the paper by Takagi et al., entitled *Surface activated bonding of silicon wafers at room temperature*, Appl. Phys. Lett. 68, 2222 (1996). It may also be used for the direct bonding of a thin supporting layer 33 of germanium onto the thin encapsulation layer 16 of silicon.

For this purpose, the free silicon surfaces (contact surfaces) of the upper walls 16.1 and of the thin supporting layer 33 have been activated in advance by partial ion beam etching, for example by using a beam of atoms of argon, or of He, Ne, Xe or Kr. If this surface preparation results in a slight etching, the thin protective layer 35 provides supplementary protection of the getter portion 34 in this step. Additionally, the thermal detectors 20 are entirely covered in this step by the mineral sacrificial layers 15, and are therefore protected from any degradation that could be caused by the partial argon beam etching.

The free silicon (or germanium) surface of the thin supporting layer 33 is therefore brought directly into contact with the upper silicon surface of the upper wall 16.1 of the thin encapsulation layer 16. The silicon contact surfaces are brought into contact under a vacuum, preferably with a vacuum pressure less than or equal to $10^{-7}$ mbar (i.e. $10^{-5}$ Pa). A pressure force, of between 0.05 and 1.6 MPa for example, may be exerted on the transferred substrate in the direction of the sensor stack.

This results in direct bonding between the surfaces in contact, by covalent silicon-silicon or silicon-germanium bonding. The bonding energy is high because of the attachment by covalent bonds, and the sealing of the cavity 2 is therefore reinforced. An adhesion of at least 2 J/m² may be obtained at ambient temperature. In this case, no post-bonding annealing is required. This avoids the risk of degradation of the readout circuit that would arise from annealing at a temperature above the thermal budget of a CMOS readout circuit contained in the substrate 11, which is approximately 350° C. to 400° C. Additionally, the bonding interface is formed here by the silicon-silicon (or silicon-germanium) surfaces, and contains no oxide that could reduce the transmission of the light radiation toward the thermal detectors 20. Thus the performance of the detection device 1 is maintained.

A temperature difference may be applied to the two stacks 10, 30 in order to generate a small mechanical tensile stress within the second stack 30, thus improving its flatness and reducing the residual mechanical stress after assembly. This temperature difference may be greater than 0° C. and less than or equal to 150° C., for example equal to about 50° C., so as to generate a tensile stress of about 25 MPa within the second stack 30.

With reference to FIG. 1E, at least a part of the supporting substrate of the second stack 30, in this case the silicon substrate 31, is advantageously eliminated. For this purpose, it is possible to carry out grinding on part of the silicon substrate 31 so as to obtain a residual layer with a thickness of several microns, followed by chemical etching of the residual layer with the etching stopping on the oxide layer 32. There are other possible techniques. For example, the oxide layer 32 may be eliminated at the same time as the mineral sacrificial layers 15.

Release vents 17.1 are then formed, to allow the discharge of the etching products from the cavity 2 during the wet chemical etching of the mineral sacrificial layers 15. They are formed by anisotropic dry etching, for example RIE etching. They may be positioned between two adjacent thermal detectors 20, or may be positioned facing the absorbent membranes 22 along the axis Z, as described in the application EP3067675A1, or preferably above the anchoring pillars. The absorbent membranes 22 may then have a penetrating opening located perpendicularly to a corresponding vent, as described in this application EP3067675A1. The release vents 17.1 extend through the oxide layer 32 (if necessary), the thin supporting layer 33 and the thin encapsulation layer 16, to open onto the underlying mineral sacrificial layer 15. A lateral release vent 17.2 is also formed through the intermediate upper wall 16.3.

With reference to FIG. 1F, chemical etching capable of eliminating the mineral sacrificial layers 15 is then carried out, in this case wet chemical etching by the action of hydrofluoric acid in the vapor phase. The products of the chemical reaction are discharged through the release vents 17.1. Since this wet chemical etching is isotropic, it results in the suspension of the absorbent membranes 22 and the thermal insulation arms, and the anchoring pillars 21 are released. The parts of the mineral sacrificial layers 15 covering the connecting portion or portions 13 are also eliminated during this chemical etching, via the lateral release vent 17.2 in this case.

Thus the cavity 2 delimited by the thin encapsulation layer 16 is released from the mineral sacrificial layers 15, the etching products of which are discharged through the release vents 17.1, 17.2. The oxide layer 32 is eliminated at the same time. The thin encapsulation layer 16 is then covered only by the thin supporting layer 33. The getter portion 34, covered by its thin protective layer 35, is then located in the cavity 2 and suspended above the readout substrate 11 by the thin supporting layer 33.

With reference to FIG. 1G, a second chemical etching is carried out, for eliminating the thin protective layer 35 and freeing the surface of the getter portion 34. In this case, the chemical etching is dry chemical etching and the etching agent is oxygen present in a plasma. Since this dry chemical etching is isotropic, the integrity of the released structures is preserved, while the access of the etching agent into the cavity 2 through the release vents 17.1 is facilitated.

With reference to FIG. 1H, a thin sealing layer 5 is deposited on the thin supporting layer 33 with a sufficient thickness to ensure the sealing, or plugging, of the release vents 17.1 opening into the cavity 2. The thin sealing layer 5 is transparent to the electromagnetic radiation to be detected.

In this case it is covered by a thin antireflection layer 6 to optimize the transmission of the radiation through the encapsulation structure. For this purpose, the thin sealing layer 5 may be made of germanium with a thickness of about 1.7 μm, and the thin antireflection layer 6 may be made of zinc sulfide with a thickness of about 1.2 μm, where the radiation to be detected is in the wavelength range from 8 μm à 12 μm. Other types of antireflection layers may be used.

The thin sealing layer 5 and antireflection layer 6 may be deposited by a thin layer vacuum deposition technique, such as the evaporation under a vacuum of a source heated by an electron beam (EBPVD) or cathode or ion beam sputtering. This results in a sealed cavity 2 under a vacuum or at reduced pressure, in which the thermal detectors 20 are housed.

The parts of the thin sealing layer 5 and the antireflection layer 6 deposited on the readout substrate 11 are then locally etched so as to give access to the connecting portions 13 and make it possible to provide an electrical connection, of the wire type (wire bonding) for example, between the connecting portions 13 and an external electrical device.

It is also possible to carry out a step of cutting out the resulting overall structure so as to dissociate the different detection devices from one another. This cutting-out step may be carried out by following cutting lines predefined by known techniques such as mechanical and/or laser cutting, chemical etching, physical etching, or others.

The chemisorption of the getter portion 34 is activated by subjecting the detection device 1 to suitable heat treatment in an oven or stove, to cause the getter material to react with residual gas molecules present in the sealed cavity and thus form stable chemical compounds. This results in a sustained or reduced vacuum level in the sealed cavity, thus improving the service life of the detection device.

Thus the fabrication method may be used to produce a detection device 1 comprising an encapsulation structure delimiting a sealed cavity 2 in which, in this case, a plurality of thermal detectors 20 are located, together with at least one getter portion 34. The encapsulation structure is formed by a thin encapsulation layer 16 that extends continuously above and around the thermal detectors 20, and by a thin supporting layer 33 assembled by direct bonding onto the thin encapsulation layer 16. A getter portion 34 is fixed to the thin supporting layer 33 and is introduced into the cavity 2 during the transfer, through the lateral indentation 4, of the thin encapsulation layer 16, which is at a distance in the plane XY from the optically active thermal detectors 20.

Thus the encapsulation structure 3 has a simplified configuration by comparison with that of the document EP3399290A1. It is formed by the thin encapsulation layers 16, supporting layers 33 and sealing layers 5, and therefore is not formed by a peripheral wall on which copper bonding blocks, a thin cap and a sealing layer rest. Additionally, the assembly of the second stack 30 onto the first stack 10 does not require the use of copper for the direct bonding, thus simplifying the fabrication method. The bonding surface is also increased, since the contact surface between the thin encapsulation layer 16 and the thin supporting layer 33 may be large, thus improving the mechanical strength.

Additionally, the assembly by SAB bonding, or by ADB bonding as described below, may be carried out at ambient temperature while obtaining high-quality sealing of the cavity 2. Thus it is possible to avoid degrading the readout circuit in the first substrate 11, or causing an undesired change in the properties of the getter. The getter can also be activated before or after the assembly step.

Since the getter portion 34 is introduced into the cavity 2 by means of the thin supporting layer 33, the mechanical support of the mineral sacrificial layers 15 can be preserved during the steps of planarizing the different mineral sacrificial layers 15 deposited. This avoids the mechanical fragility mentioned in the document EP3239670A1, which is apparent during the planarization of the mineral sacrificial layers 15 when they rest on a thin protective layer 35 of polyimide, in the case where the getter portion 34 is located under a thermal detector and is protected from the HF vapor etching by the polyimide carbonaceous layer. This is because, in the context of the invention, the mineral sacrificial layers 15 do not rest on a carbonaceous sacrificial layer that would protect a getter portion 34 resting on the substrate 11, so that this mechanical fragility is avoided in this case.

Additionally, the mineral sacrificial layers 15 are formed in the first stack 10, before assembly with the second stack 20 that comprises the thin protective layer 35. Therefore they are not deposited on, and in contact with, the thin protective layer 35, as in the document EP3239670A1, making it possible to preserve the inert nature of the amorphous carbon in relation to the wet etching used to eliminate the mineral sacrificial layers 15. In fact, the inventors have found that the deposition of a mineral sacrificial layer 15 on and in contact with a layer of amorphous carbon may cause the degradation of the inert nature of the amorphous carbon in relation to wet etching such as HF vapor etching.

Additionally, the thin protective layer 35 is advantageously kept at a distance from the mineral sacrificial layer 15. A layer of air is then located between the thin protective layer 35 and the mineral sacrificial layers 15, so that there is a spacing between the mineral sacrificial layers 15 and the thin protective layer 35. This air layer provides a sufficient tolerance, notably in relation to errors of alignment.

Moreover, the getter portion 34 is not located facing the absorbent membranes 22, as is the case in the document EP3239670A1, making it possible to use a larger surface area of getter material. Furthermore, the getter material may be chosen solely on the basis of its chemisorption properties, and not on the basis of a supplementary property of optical reflection. A getter material having a high chemisorption performance may therefore be chosen.

FIG. 2 is a schematic and partial sectional view of a detection device 1 produced by a fabrication method according to a variant of the first embodiment.

In this case, the detection device 1 differs from those described previously essentially in that it comprises at least one compensation thermal detector 7, positioned in a sealed cavity 2, with the getter portion 34 facing it. Thus the getter portion 34 is positioned at a distance from the thermal detectors 20 intended to detect the infrared radiation, so as not to interfere with the transmission of the electromagnetic radiation toward these thermal detectors 20. However, it is positioned facing the compensation thermal detector 7, and notably facing the whole of its suspended membrane, so as to block the transmission of the electromagnetic radiation toward this thermal detector 7. The getter portion 34 is therefore made of a material and with a thickness such that it does not transmit the electromagnetic radiation to be detected. In other words, the getter portion 34 is opaque to the electromagnetic radiation to be detected.

FIGS. 3A to 3F show different steps of a fabrication method according to a second embodiment in which the direct bonding is of the ADB (Atomic Diffusion Bonding) type. This bonding technique is notably suitable for the bonding of two sub-layers at ambient temperature, without any intermediate bonding material such as resin or polymer. It is, notably, described in the paper by Shimatsu and Uomoto, entitled *Atomic diffusion bonding of wafers with thin nanocrystalline metal films*, J. Vac. Sci. Technol. B 28, 706 (2010).

For this purpose, the bonding surfaces of the thin encapsulation layer 16 and of the thin supporting layer 33 are formed by bonding sub-layers 19, 37, preferably made of titanium Ti or amorphous carbon, having a thickness chosen in order to limit the absorption of the electromagnetic radiation to be detected, for example a thickness less than or equal to 1 nm, for example equal to 0.5 nm. Amorphous carbon is advantageous because of its higher selectivity (inertness) in relation to HF vapor wet etching, as compared with titanium. In the HF vapor etching, any etching of the bonding sub-layers from the vents remains limited.

With reference to FIG. 3A, a first stack 10, in this case similar to that described with reference to FIG. 1A, is formed. This step is identical to those described previously and will not be detailed again.

With reference to FIG. 3B, the lateral indentation 4 is formed, in an identical or similar manner to the step described with reference to FIG. 1B. A bonding sub-layer 19 is then deposited by physical deposition in the vapor phase (evaporation, sputtering, etc.) under a vacuum, for example at a pressure less than or equal to $2\times10^{-6}$ Pa, so as to cover the upper surface of the thin encapsulation layer 16. In this case, a bonding sub-layer 19 is also deposited on the bottom surface 4.2 of the lateral indentation 4. In a variant, the bonding sub-layer 19 may be deposited before the lateral indentation 4 is formed. The upper wall 16.1 of the thin encapsulation layer 16 is therefore formed by a sub-layer 19, of silicon for example, made in one piece with the peripheral wall 16.2, and a bonding sub-layer 19.

With reference to FIG. 3C, a second stack 30, similar to that described previously, is formed. However, a second bonding sub-layer 37, preferably identical in thickness and material to the first bonding sub-layer 19, is deposited on the thin supporting layer 33, and in this case on the thin protective layer 35. This sub-layer, in this case, is a thin layer 37 of titanium or amorphous carbon with a thickness of approximately 0.5 nm. More precisely, the thin supporting layer 33 is formed by a sub-layer 36 of silicon (for an SOI substrate) or germanium (for a GeOI substrate), and by the second bonding sub-layer 37. Part of the bonding sub-layer 37 is deposited on the upper surface of the thin protective layer 35.

Figure 3D:
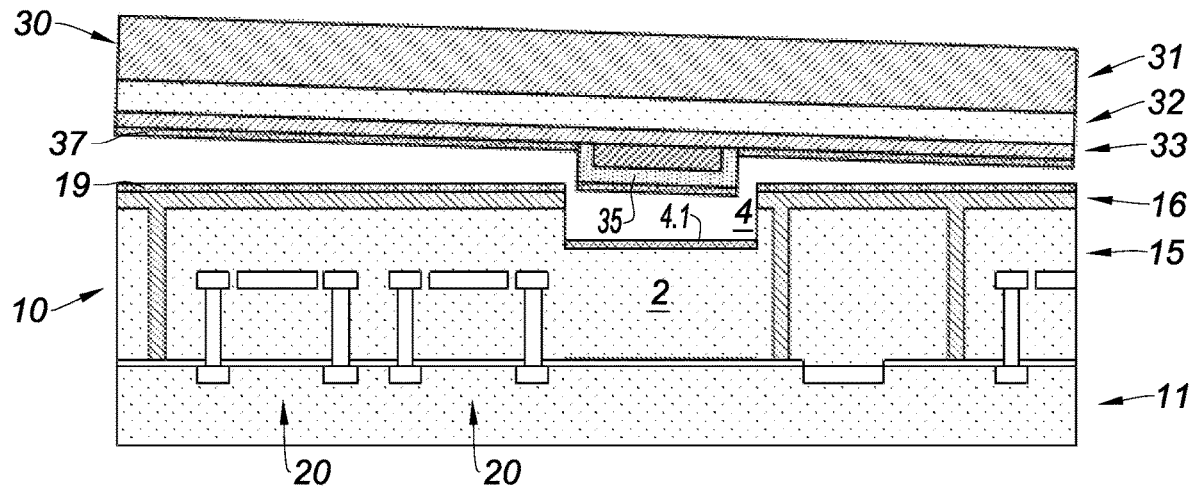

With reference to FIG. 3D, the second stack 30 is assembled onto the first stack 10, by bringing the two bonding sub-layers 19, 37, which cover the sub-layer 18 and the sub-layer 36 respectively, into contact under a vacuum at ambient temperature. Since these bonding sub-layers 19, 37 are formed of a nanocrystalline material, that is to say a crystalline material with a thickness of the order of a few nanometers at most, direct bonding between these two metallic surfaces is achieved. The atomic diffusion at the bonding interface enables the cavity 2 to be more strongly sealed. The part of the bonding sub-layer 37 that covers the thin protective layer 35 is spaced apart, in this case, by a non-zero distance along the axis Z from the part of the bonding sub-layer 19 that is located on the bottom surface 4.2 of the lateral indentation 4.

Figure 3E:
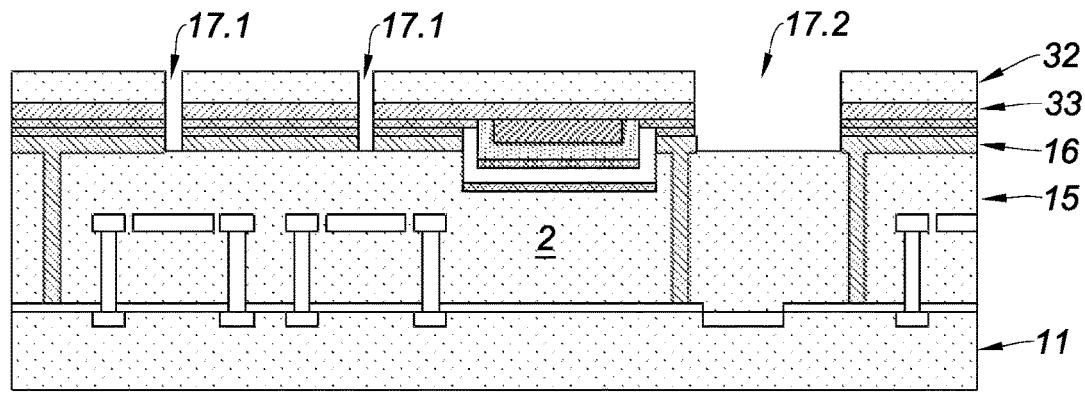

With reference to FIG. 3E, the release vents 17.1 opening onto the mineral sacrificial layer 15 located in the cavity 2 are formed, together with a lateral vent 17.2 opening into the lateral cavity 2.1.

Figure 3F:
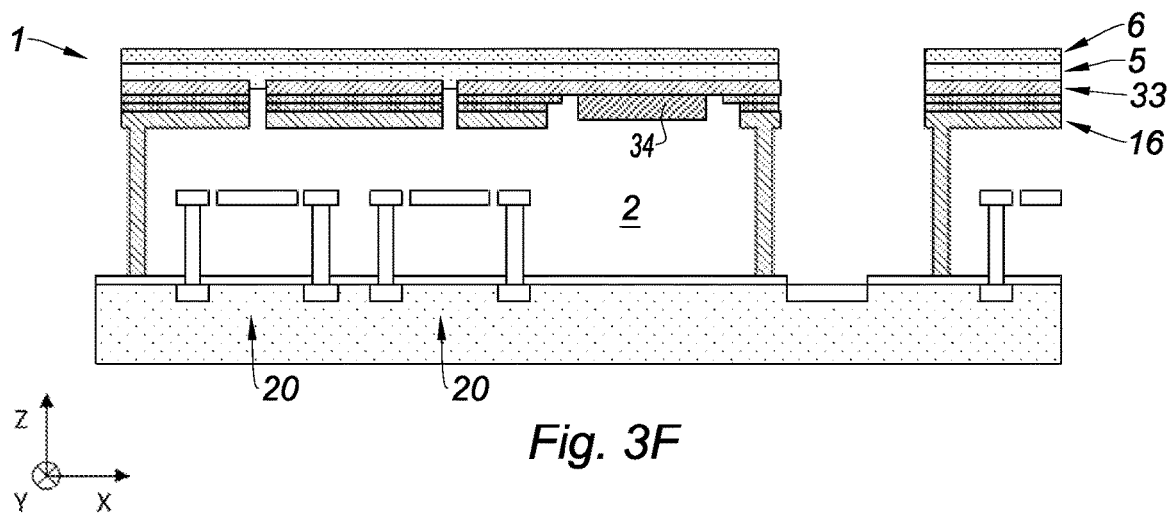

With reference to FIG. 3F, the wet chemical etching for eliminating the mineral sacrificial layers 15, and thus the oxide layer 32, is carried out. In this case, the part of the bonding sub-layer 37 covering the thin protective layer 35 is eliminated if it is made of titanium. The dry chemical etching is then carried out in order to eliminate the thin protective layer 35. The part of the bonding sub-layer 37 covering the thin protective layer 35, when made of amorphous carbon, is eliminated in this step of dry chemical etching. Thus the surface of the getter portion 34 is left free. The thin sealing layer 5, and in this case the thin antireflection layer 6, is then deposited.

Particular embodiments have just been described. Various modifications and variants will be apparent to a person skilled in the art. It is possible to structure the lower surface of the thin encapsulation layer 16, notably as described in the document EP3196615A1, to add an optical function (antireflection, etc.) to it, thus improving the performance of the detection device.

The invention claimed is:

1. Method for fabricating a device for detecting electromagnetic radiation comprising the following steps:
forming a first stack, comprising:
at least one thermal detector resting on the first substrate, configured to detect the electromagnetic radiation, and covered with at least one mineral sacrificial layer made of a mineral material that can be eliminated by a first chemical etching;
a thin encapsulation layer, extending above the thermal detector and contributing to the delimiting of a cavity in which the thermal detector is located, comprising an upper part resting on the mineral sacrificial layer;
at least one lateral indentation, extending through the upper part of the thin encapsulation layer and part of the mineral sacrificial layer, and being located at a distance from the thermal detector in a plane parallel to the plane of the first substrate;
forming a second stack, comprising:
a thin supporting layer, transparent to the electromagnetic radiation, resting on a supporting substrate,
at least one getter portion positioned on the thin supporting layer and partially covering the latter, and
a thin protective layer, covering the getter portion, made of a carbonaceous material that can be eliminated by a second chemical etching;
assembling the first and second stacks by bringing the thin supporting layer into contact with the upper part of the thin encapsulation layer and directly bonding it thereto, so that the getter portion is located in the lateral indentation; then
forming at least one release vent through the thin supporting layer and the upper part of the thin encapsulation layer, opening onto the mineral sacrificial layer; then
eliminating the mineral sacrificial layer by the first chemical etching;
eliminating the thin protective layer by the second chemical etching;
depositing a thin sealing layer on the thin supporting layer so as to block the release vent.

2. The method according to claim 1, wherein the assembly step is carried out at ambient temperature with a vacuum pressure less than or equal to $10^{-5}$ Pa.

3. The method according to claim 1, wherein the carbonaceous material of the thin protective layer is chosen from amorphous carbon and polyimide.

4. The method according to claim 1, wherein the lateral indentation has dimensions such that, in the assembly step, the thin protective layer is at a distance from the mineral sacrificial layer.

5. The method according to claim 1, wherein the thin encapsulation layer is silicon-based, and the thin supporting layer is silicon- or germanium-based.

6. The method according to claim 1, wherein the thin encapsulation layer has a contact surface made of silicon, and the thin supporting layer has a contact surface made of silicon or germanium, and wherein the step of assembly by direct bonding comprises activation of said contact surfaces by partial ion beam etching and vacuum bonding.

7. Method according to claim 1, wherein the upper part of the thin encapsulation layer is formed by a sub-layer made of silicon and a first bonding sub-layer, the thin supporting layer being formed by a silicon- or germanium-based sub-layer and a second bonding sub-layer, the two bonding sub-layers being transparent to the electromagnetic radiation to be detected, and wherein the step of assembly by direct bonding comprises bringing the two metallic sub-layers into contact with one another under a vacuum.

8. The method according to claim 7, wherein said bonding sub-layers each have a thickness less than or equal to 1 nm.

9. The method according to claim 7, wherein said bonding sub-layers are made of a metallic material or of amorphous carbon.

10. The method according to claim 1, wherein the first stack comprises a plurality of arrays of thermal detectors, each array being located in a distinct cavity delimited at least partially by a thin encapsulation layer, the thin supporting layer coming into contact with the upper parts of the different thin encapsulation layers.

11. The method according to claim 1, wherein the getter portion is located facing a thermal compensation detector, which is configured not to receive the electromagnetic radiation, the getter portion being opaque to the electromagnetic radiation.

12. A device for detecting electromagnetic radiation, comprising:
   a substrate;
   at least one thermal detector resting on the substrate and configured to detect the electromagnetic radiation;
   a thin encapsulation layer, extending above and around the thermal detector and contributing to the delimiting of a cavity in which the thermal detector is located, comprising an upper part extending above the thermal detector and a peripheral part extending around the thermal detector in a plane parallel to the substrate;
   at least one lateral indentation, extending through the upper part of the thin encapsulation layer, and located at a distance from the thermal detector in a plane parallel to the plane of the substrate;
   a thin supporting layer, transparent to the electromagnetic radiation, resting in contact with the upper part of the thin encapsulation layer, the thin supporting layer having a flat upper surface opposite the substrate;
   at least one getter portion assembled onto the thin supporting layer and positioned in the lateral indentation;
   at least one release vent extending through the thin supporting layer and the upper part of the thin encapsulation layer;
   a thin sealing layer covering the thin supporting layer and blocking the release vent.

* * * * *